(12) United States Patent
Otsuki et al.

(10) Patent No.: US 8,441,076 B2
(45) Date of Patent: May 14, 2013

(54) SRAM

(75) Inventors: Kazutaka Otsuki, Kanagawa (JP);
Jun-ichi Takizawa, Kanagawa (JP)

(73) Assignee: Renesas Electronics Corporation, Kanagawa (JP)

(*) Notice: Subject to any disclaimer, the term of this patent is extended or adjusted under 35 U.S.C. 154(b) by 121 days.

(21) Appl. No.: 13/100,745

(22) Filed: May 4, 2011

(65) Prior Publication Data
US 2011/0278677 A1 Nov. 17, 2011

(30) Foreign Application Priority Data
May 17, 2010 (JP) ................. 2010-113122

(51) Int. Cl.
*H01L 31/119* (2006.01)
(52) U.S. Cl.
USPC ..... 257/393; 257/379; 257/380; 257/E27.099
(58) Field of Classification Search .......... 257/379–381, 257/393, E27.099
See application file for complete search history.

(56) References Cited

U.S. PATENT DOCUMENTS
6,242,781 B1 * 6/2001 Batra et al. ............... 257/380

FOREIGN PATENT DOCUMENTS
JP 10-135355 A 5/1998

* cited by examiner

*Primary Examiner* — H. Jey Tsai
(74) *Attorney, Agent, or Firm* — Foley & Lardner LLP

(57) ABSTRACT

An exemplary aspect of the present invention is an SRAM including: a first gate electrode that constitutes a first load transistor; a second gate electrode that extends in a longitudinal direction of the first gate electrode so as to be spaced apart from the first gate electrode, and constitutes a first drive transistor; a third gate electrode that extends in parallel to the first gate electrode, and constitutes a second load transistor; a first p-type diffusion region that is formed so as to intersect with the third gate electrode, and constitutes the second load transistor; and a first shared contact formed over the first and second gate electrodes and the first p-type diffusion region. The first p-type diffusion region extends to the vicinity of a first gap region between the first and second gate electrodes, and is not formed in the first gap region.

7 Claims, 9 Drawing Sheets

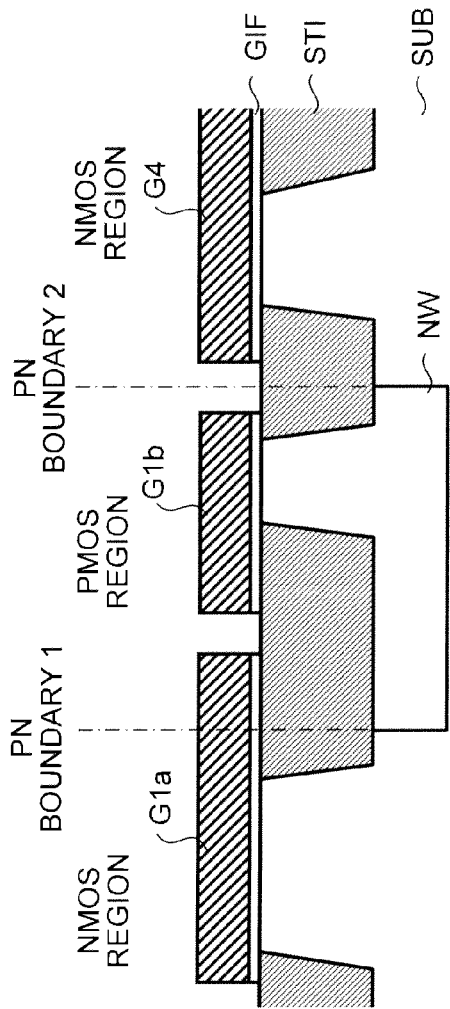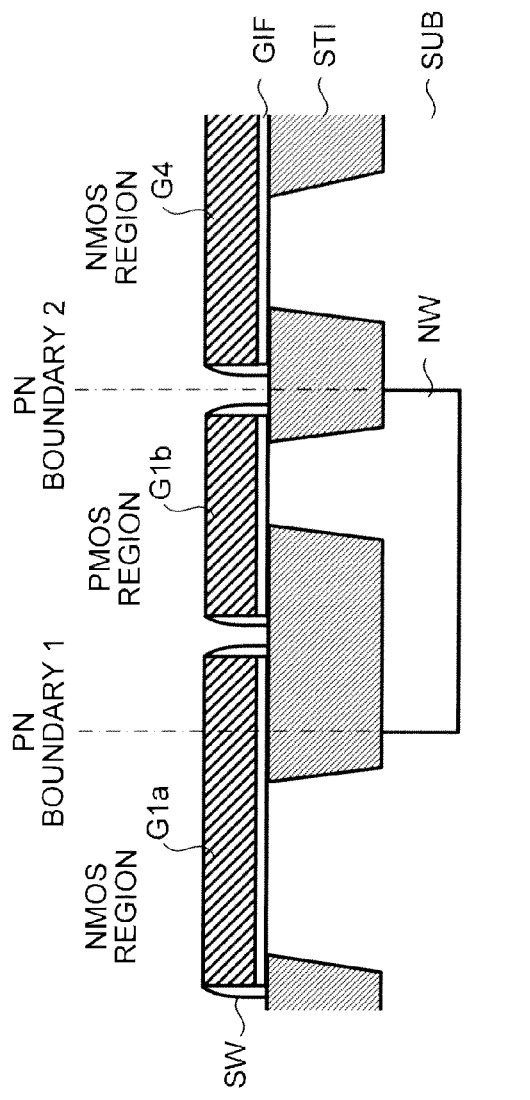
Fig. 3A
Fig. 3B

SRAM

CROSS-REFERENCE TO RELATED APPLICATIONS

This application is based upon and claims the benefit of priority from Japanese patent application No. 2010-113122, filed on May 17, 2010, the disclosure of which is incorporated herein in its entirety by reference.

BACKGROUND

The present invention relates to an SRAM.

Along with the recent increase in capacity and reduction in chip size of SRAMs (Static Random Access Memories), there is a demand for further miniaturization of memory cells. FIG. 7 shows FIG. 1 of Japanese Unexamined Patent Application Publication No. 10-135355. The SRAM shown in FIG. 7 is a complete CMOS (Complementary Metal Oxide Semiconductor) type SRAM, and includes four NMOS transistors and two PMOS transistors. Specifically, the SRAM includes two access transistors AT11 and AT12 which are NMOS transistors; two drive transistors DT11 and DT12 which are NMOS transistors; and two drive transistors LT11 and LT12 which are PMOS transistors. Each area indicated by the dashed line in FIG. 7 represents a contact CT. Each hatched area represents a diffusion region DA.

As shown in FIG. 7, a gate electrode G11a of the NMOS transistor DT11 for driving and a gate electrode G11b of the PMOS transistor LT11 for loading, which have been integrally formed up to now, are separated from each other. Similarly, a gate electrode G12a of the NMOS transistor DT12 for driving and a gate electrode G12b of the PMOS transistor LT12 for loading, which have been integrally formed up to now, are separated from each other. This configuration prevents mutual diffusion of p-type impurities and n-type impurities in the gate electrodes.

SUMMARY

In the SRAM disclosed in Japanese Unexamined Patent Application Publication No. 10-135355, the diffusion region DA is also formed in the gap region between the gate electrode G11a and the gate electrode G11b. The present inventors have found a problem that when the width of the gap region is narrowed with the miniaturization of memory cells, a leak current occurs in the gap region. This leak current seems to be caused by a failure in a silicide process, but the details of the mechanism by which the leak current occurs are still not clear.

A first aspect of the present invention is an SRAM including: a first gate electrode that constitutes a first load transistor; a second gate electrode that extends in a longitudinal direction of the first gate electrode so as to be spaced apart from the first gate electrode, the second gate electrode constituting a first drive transistor; a third gate electrode that extends in parallel to the first gate electrode and constitutes a second load transistor; a first p-type diffusion region that is formed so as to intersect with the third gate electrode, and constitutes the second load transistor; and a first shared contact which is formed over the first and second gate electrodes and the first p-type diffusion region. The first p-type diffusion region extends to the vicinity of a first gap region between the first and second gate electrodes, and is not formed in the first gap region.

The first p-type diffusion region extends to the vicinity of the first gap region between the first and second gate electrodes, and is not formed in the first gap region. This configuration makes it possible to provide an SRAM including a miniaturized memory cell in which a leak current is suppressed.

According to an exemplary aspect of the present invention, it is possible to provide an SRAM including a miniaturized memory cell in which a leak current is suppressed.

BRIEF DESCRIPTION OF THE DRAWINGS

The above and other aspects, advantages and features will be more apparent from the following description of certain embodiments taken in conjunction with the accompanying drawings, in which:

FIG. 3A is a sectional view taken along the line III-III of FIG. 1 for illustrating a manufacturing method;

FIG. 3B is a sectional view taken along the line III-III of FIG. 1 for illustrating a manufacturing method;

DETAILED DESCRIPTION

Exemplary embodiments of the present invention will now be described in detail with reference to the accompanying drawings. It should be noted that the present invention is not limited to the embodiments described below. For the clarity of the explanation, the following descriptions and the drawings are simplified as appropriate.

First Embodiment

Figure 1:
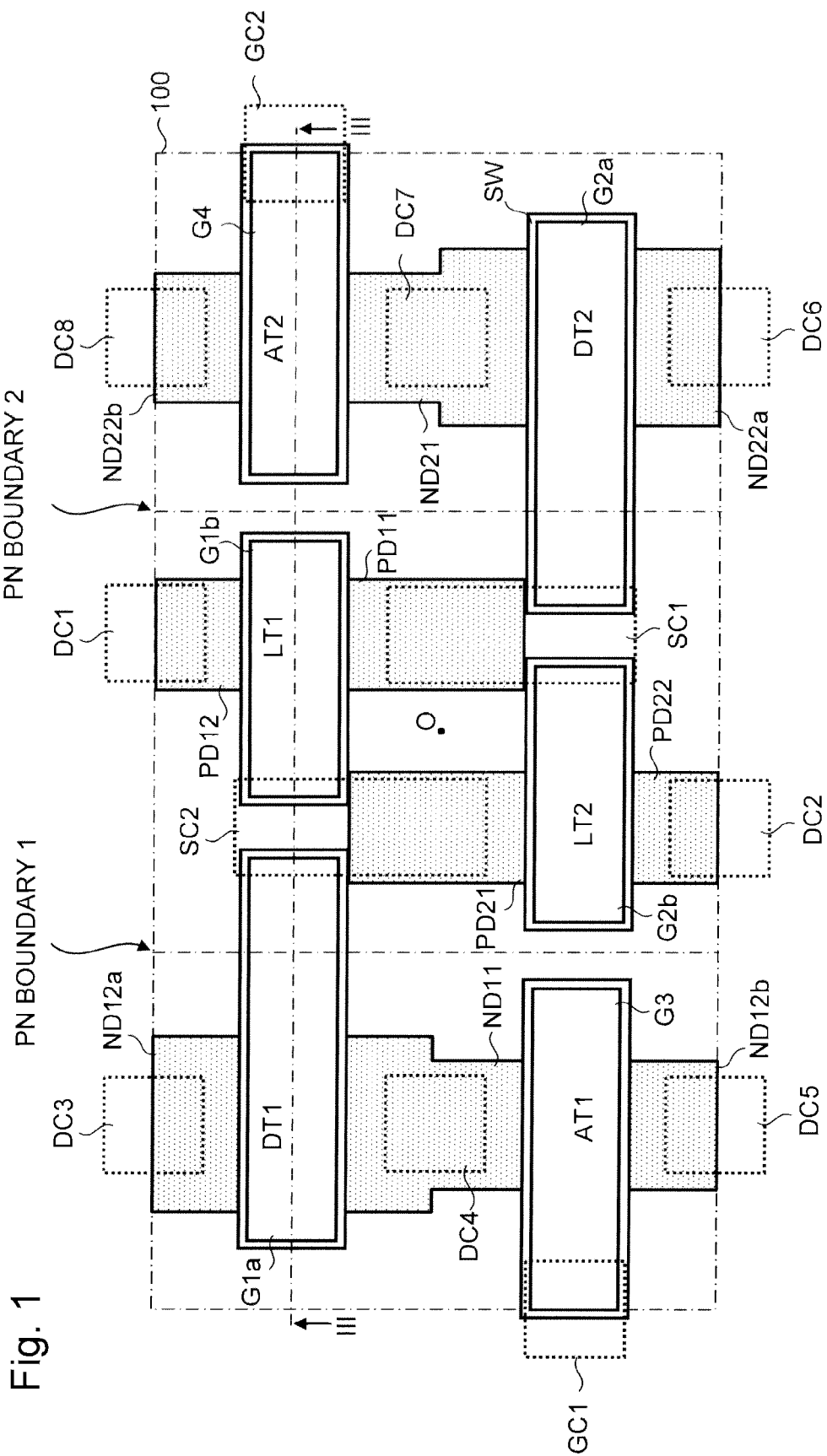
FIG. 1 is a plan view showing a unit memory cell of an SRAM according to a first embodiment of the present invention.

FIG. 1 is a plan view of a unit memory cell 100 of an SRAM according to a first embodiment of the present invention. As shown in FIG. 1, the unit memory cell 100 includes six gate electrodes G1a, G1b, G2a, G2b, G3, and G4, six n-type diffusion regions ND11, ND12a, ND12b, ND21, ND22a, and ND22b, four p-type diffusion regions PD11, PD12, PD21, and PD22, eight diffusion region contacts DC1 to DC8, two gate contacts GC1 and GC2, and two shared contacts SC1 and SC2. A side wall SW is formed around each of the gate electrodes.

The unit memory cell 100 has a rectangular outer shape defined by a boundary indicated by an alternate long and short dash line. Further, the unit memory cell 100 has a layout structure symmetrical about a center O. Accordingly, the gate electrodes G1a and G1a have the same shape; the gate electrodes G1b and G2b have the same shape; the p-type diffusion regions PD11 and PD12 have the same shape; the p-type diffusion regions PD21 and PD22 have the same shape; the gate electrodes G3 and G4 have the same shape; the n-type diffusion regions ND and ND21 have the same shape; the n-type diffusion regions ND12a and ND22a have the same shape; and the n-type diffusion regions ND12b and ND22b have the same shape. Furthermore, the layout structure of the unit memory cell 100 is line symmetrical with respect to boundaries corresponding to the four sides of the rectangle indicated by the alternate long and short dash line.

The SRAM shown in FIG. 1 is a complete CMOS type SRAM. Accordingly, the unit memory cell 100 includes four NMOS transistors and two PMOS transistors. Specifically, the unit memory cell 100 includes two access transistors AT1 and AT2 which are NMOS transistors; two drive transistors DT1 and DT2 which are NMOS transistors; and two load transistors LT1 and LT2 which are PMOS transistors. In this case, the drive transistor DT1 and the load transistor LT1 constitute an inverter. Similarly, the drive transistor DT2 and the load transistor LT2 constitute an inverter.

As shown in FIG. 1, the access transistor All includes the gate electrode G3 and the n-type diffusion regions ND11 and ND12b. The drive transistor DT1 includes the gate electrode G1a and the n-type diffusion regions ND11 and ND12a. In other words, the n-type diffusion region ND11 is shared by the access transistor AT1 and the drive transistor DT1. The load transistor LT1 includes the gate electrode G1b and the p-type diffusion regions PD11 and PD12. The gate electrode G1b extends in the longitudinal direction of the gate electrode G1a so as to be spaced apart from the gate electrode G1a.

In this case, the n-type diffusion regions ND12a, ND11, and ND12b extend linearly and are formed to be perpendicular to both the gate electrodes G1a and G3. Further, the p-type diffusion regions PD11 and PD12 are formed in parallel to the n-type diffusion regions ND12a, ND11, and ND12b. That is, the p-type diffusion regions PD11 and PD12 are perpendicular to the gate electrode G1b. Furthermore, the p-type diffusion region PD11 extends to the vicinity of a gap n between the gate electrodes G2a and G2b which are formed in parallel to the gate electrode G1b, and the p-type diffusion region PD11 is not formed in the gap region. The gate electrode G3 is formed as an extension of the gate electrode G2b on the opposite side to the gate electrode G2a.

Similarly, the access transistor AT2 includes the gate electrode G4 and the n-type diffusion regions ND21 and ND22b. The drive transistor DT2 includes the gate electrode G2a and the n-type diffusion regions ND21 and ND22a. In other words, the n-type diffusion region ND21 is shared by the access transistor AT2 and the drive transistor DT2. The load transistor LT2 includes the gate electrode G2b and the p-type diffusion regions PD21 and PD22. The gate electrode G2b extends in the longitudinal direction of the gate electrode G2a so as to be spaced apart from the gate electrode G2a.

In this case, the n-type diffusion regions ND22a, ND21, and ND22b extend linearly and are formed to be perpendicular to both the gate electrodes G2a and G4. Further, the p-type diffusion regions PD21 and PD22 are formed in parallel to the n-type diffusion regions ND22a, ND21, and ND22b. That is, the p-type diffusion regions PD21 and PD22 are perpendicular to the gate electrode G2b. Furthermore, the p-type diffusion region PD21 extends to the vicinity of a gap region between the gate electrodes G1a and G1b which are formed in parallel to the gate electrode G2b, and the p-type diffusion region PD21 is not formed in the gap region. The gate electrode G4 is formed as an extension of the gate electrode G1b on the opposite side to the gate electrode G1a.

The gate electrode G3 of the access transistor AT1 and the gate electrode G4 of the access transistor AT2 are connected to a common word line (not shown) through the gate contacts GC1 and GC2, respectively. The gate contacts GC1 and GC2 are formed on the boundary of the unit memory cell 100. The n-type diffusion region ND12b constituting the access transistor AT1 and the n-type diffusion region ND22b constituting the access transistor AT2 are connected to a bit line pair (not shown) through the diffusion region contacts DC5 and DC8, respectively.

The n-type diffusion region ND12a constituting the source of the drive transistor DT1 and the n-type diffusion region ND22a constituting the source of the drive transistor DT2 are connected to a ground through the diffusion region contacts DC3 and DC6, respectively. The p-type diffusion region PD12 constituting the source of the load transistor LT1 and the p-type diffusion region PD22 constituting the source of the load transistor LT2 are connected to a power supply through the diffusion region contacts DC1 and DC2, respectively.

The gate electrode G1a constituting the drive transistor DTI and the gate electrode G1b constituting the load transistor LT1 are connected to the p-type diffusion region PD21, which constitutes the drain of the load transistor LT2, through the shared contact SC2. Further, the shared contact SC2 is connected to the n-type diffusion region ND21, which is shared by the access transistor AT2 and the drive transistor DT2, through a metal wire (not shown) and the diffusion region contact DC7.

Similarly, the gate electrode G2a constituting the drive transistor DT2 and the gate electrode G2b constituting the load transistor LT2 are connected to the p-type diffusion region PD11, which constitutes the drain of the load transistor LT1 through the shared contact SC1. Further, the shared contact SCI is connected to the n-type diffusion region ND11, which is shared by the access transistor AT1 and the drive transistor DT1, through a metal wire (not shown) and the diffusion region contact DC4.

As described above, in this embodiment, no diffusion region is formed in the gap region between the gate electrodes G1a and G1b, so that the occurrence of a leak current in the gap region narrowed due to the miniaturization can be suppressed. Similarly, the diffusion region is not formed in the gap region between the gate electrodes G2a and G2b, and the occurrence of leak current in the gap region which is narrowed due to miniaturization can be suppressed.

Figure 7:
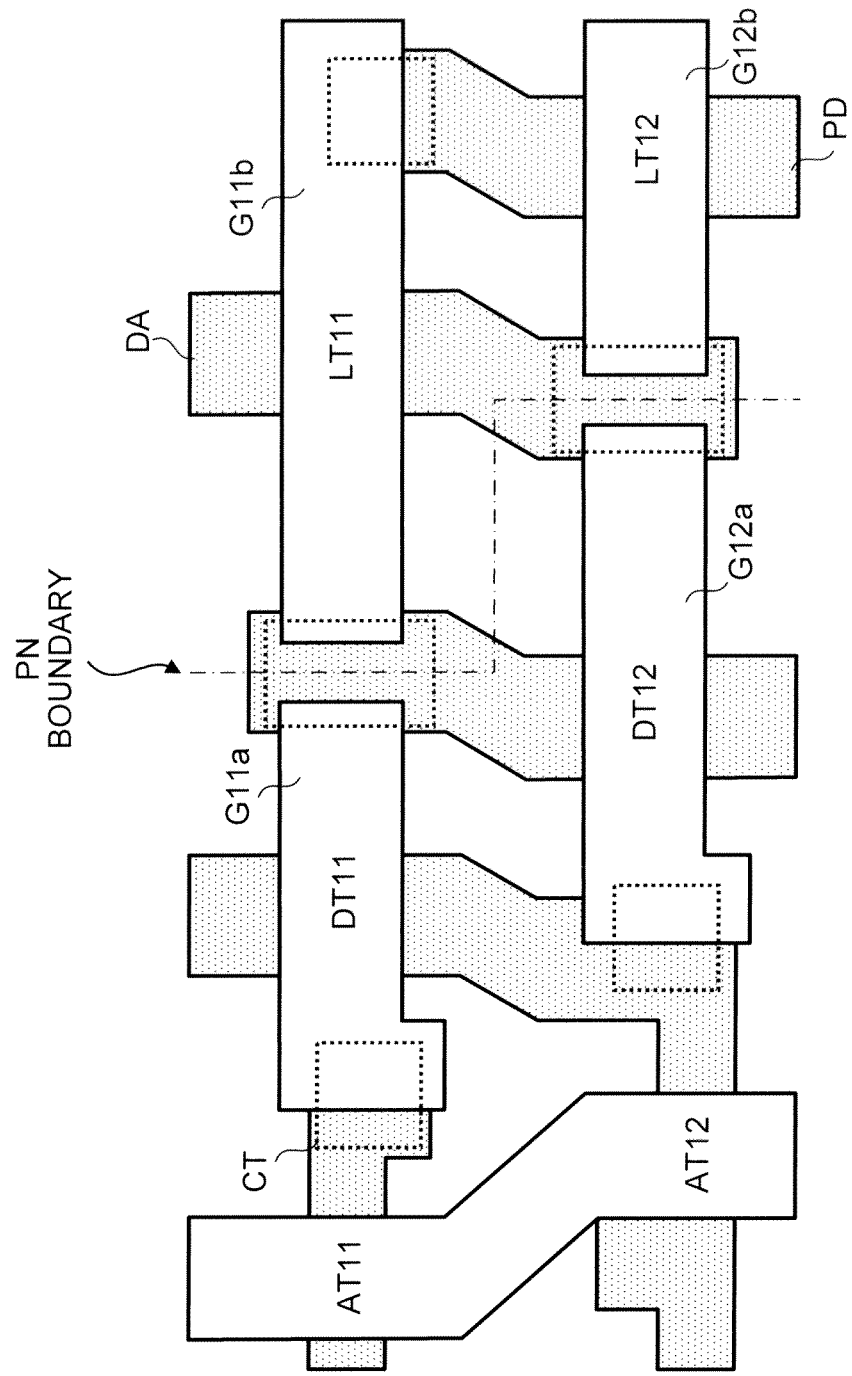
FIG. 7 shows FIG. 1 of Japanese Unexamined Patent Application Publication No. 10-135355.

As shown in FIG. 7, for example, when a diffusion region having a PN boundary is formed in the gap between the gate electrode G11a and the gate electrode G11b, a high-concentration P+ diffusion region and a high-concentration N+ diffusion region are adjacent to each other. This leads to a possibility that a leak current may occur between the both regions. Meanwhile, in the present invention, no diffusion region is formed in the gap region between the gate electrodes G1a and G1b, so that the occurrence of a leak current in the gap region can be suppressed.

Figure 2:
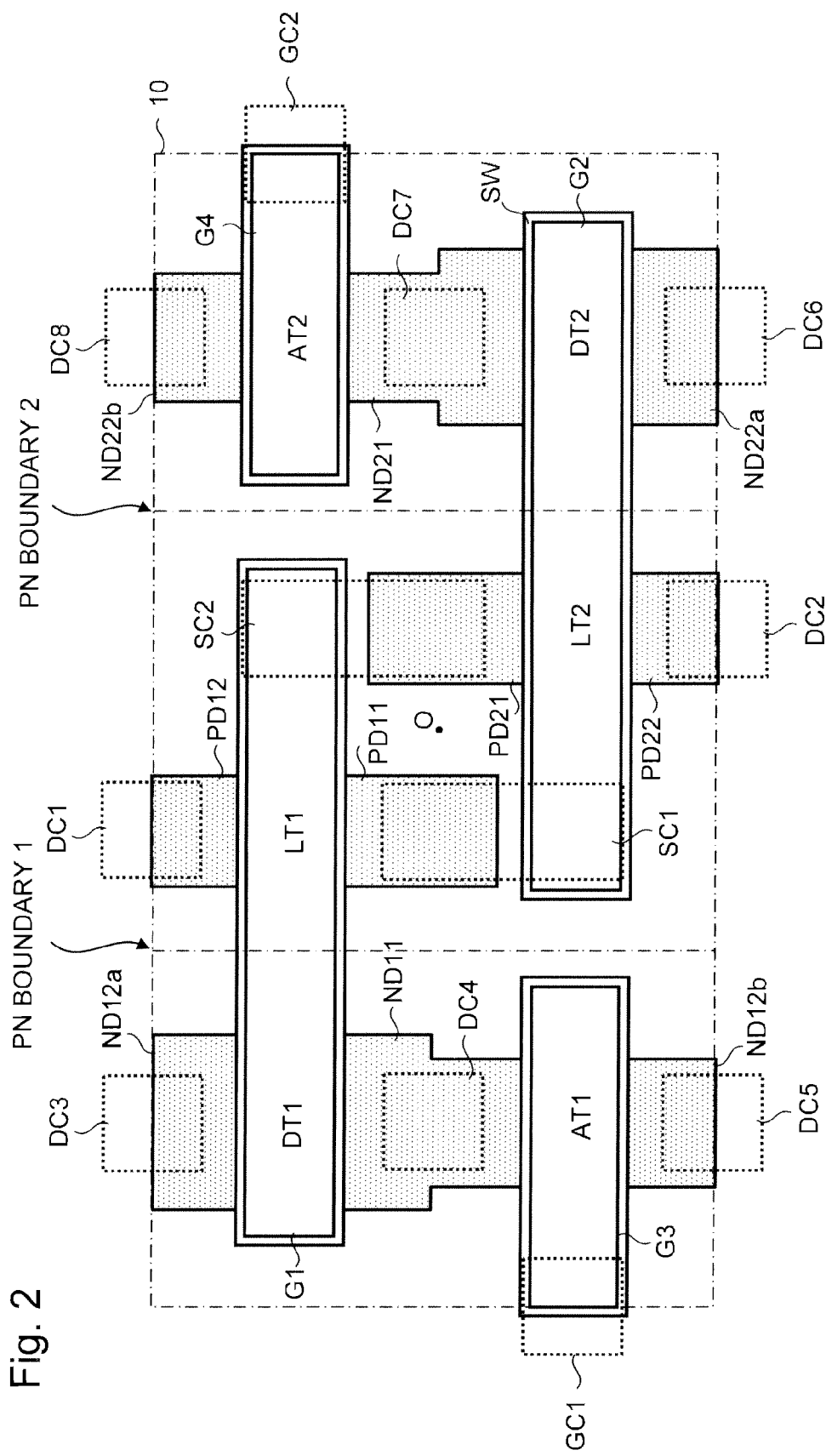
FIG. 2 is a plan view of a unit memory cell of an SRAM according to a comparative example of the first embodiment.

FIG. 2 is a plan view of a unit memory cell 10 of an SRAM according to a comparative example of the first embodiment. Unlike FIG. 1, in the comparative example shown in FIG. 2, the gate electrode of the drive transistor DT1 and the gate electrode of the load transistor LT1 are integrally formed as a gate electrode G1. Similarly, the gate electrode of the drive transistor DT2 and the gate electrode of the load transistor LT2 are integrally formed as a gate electrode G2. Referring to FIG. 2, unlike FIG. 1, the positional relationship between the p-type diffusion regions PD11 and PD12 and the positional relationship between the p-type diffusion regions PD21 and PD22 are reversed.

Referring to FIG. 2, the gate electrode G2 is formed to be spaced apart by a certain margin from the p-type diffusion region PD11 so that the side wall SW of the gate electrode G2 is prevented from overlapping the p-type diffusion region PD11. Thus, as compared with FIG. 1, the contact area between the p-type diffusion region PD11 and the shared contact SCI decreases in the comparative example shown in FIG. 2, resulting in an increased resistance. Similarly, referring to FIG. 2, the gate electrode G1 is formed to be spaced apart by a certain margin from the p-type diffusion region PD21 so that the side wall SW of the gate electrode G1 is prevented from overlapping the p-type diffusion region PD21. Thus, as compared with FIG. 1, the contact area between the p-type diffusion region PD21 and the shared contact SC2 decreases in the comparative example shown in FIG. 2, resulting in an increased resistance.

Meanwhile, in the vicinity of the tip end of the p-type diffusion region PD11 shown in FIG. 1, the gate electrode is separated into the gate electrodes G2a and G2b. Since the gate electrodes are separated from each other, the tip ends of the gate electrodes G2a and G2b are tapered and rounded during processing. Thus, p-type impurities can be sufficiently implanted into a region in the vicinity of the tip end of the p-type diffusion region PD11. Accordingly, as compared with FIG. 2, the region of the p-type diffusion region PD11 in which the p-type impurities are sufficiently implanted can be formed so as to be in contact with the gate electrodes G2a and G2b. As a result, the contact area between the p-type diffusion region PD11 and the shared contact SC2 increases, resulting in a reduced resistance. Even when a misalignment occurs between the gate electrodes G2a and G2b on the side of the p-type diffusion region PD11, the decrease in the contact area between the p-type diffusion region PD11 and the shared contact SC1 can be minimized, thereby suppressing an increase in resistance.

Similarly, the gate electrodes G1a and G1b are separated from each other in the vicinity of the tip end of the p-type diffusion region PD21. Accordingly, the contact area between the p-type diffusion region PD21 and the shared contact SC2 increases, resulting in a reduced resistance.

Figure 3C:
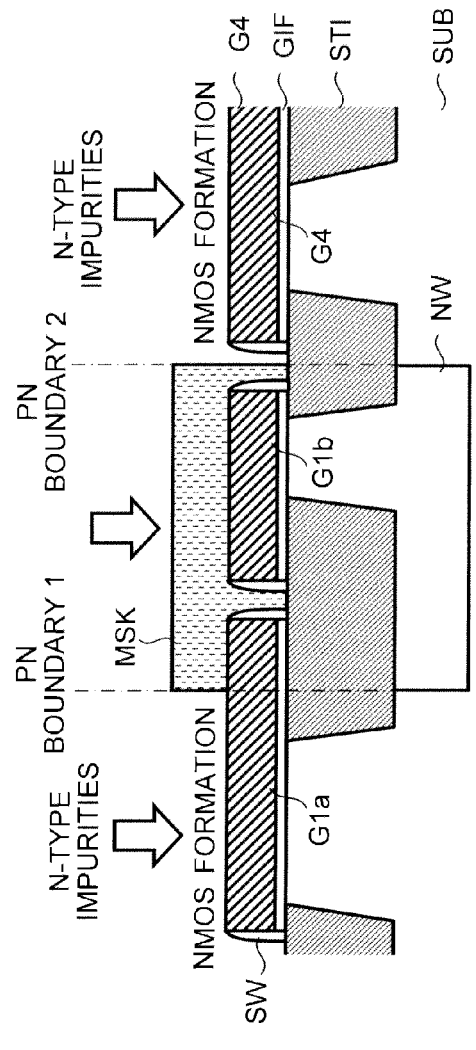
FIG. 3C is a sectional view taken along the line III-III of FIG. 1 for illustrating a manufacturing method.

Referring next to FIGS. 3A to 3F, a method for manufacturing the SRAM shown in FIG. 1 will be described. FIGS. 3A to 3F are sectional views taken along the line of FIG. 1 for illustrating the manufacturing method. First, on a p-type semiconductor substrate SUB in which an isolation layer STI and an N-well NW are formed, a gate insulating film GIF formed of $SiO_2$ or the like and a gate electrode layer formed of polysilicon or the like are formed. The gate insulating film GIF and the gate electrode layer are patterned by a photolithographic process to thereby form the gate electrodes G1a, G1b, and G4 each having an island shape as shown in FIG. 1 (FIG. 3A). Referring to FIGS. 3A to 3F, a PN boundary (a boundary between a p-type impurity implantation region and an n-type impurity implantation region) 1 and a PN boundary 2 match boundaries between the p-type semiconductor substrate and the N-well. However, the boundaries do not necessarily match each other.

Figure 3D:
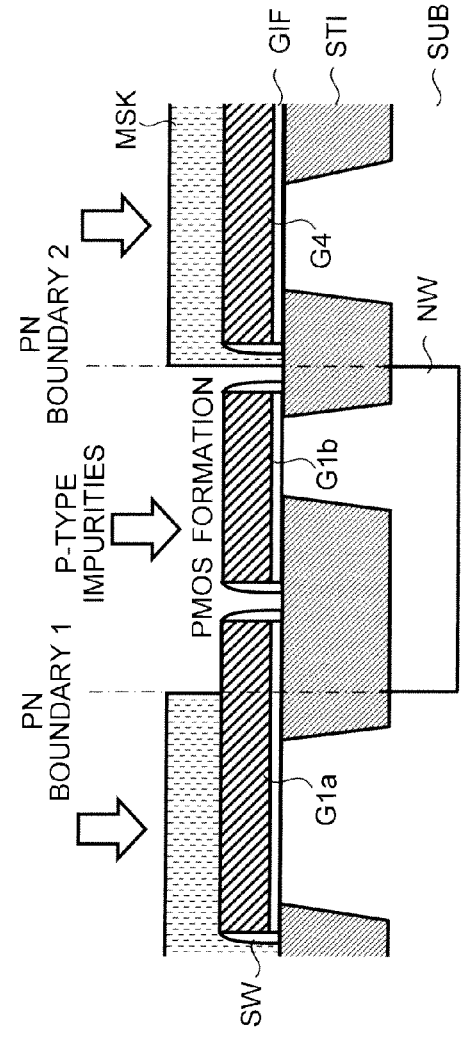
FIG. 3D is a sectional view taken along the line III-III of FIG. 1 for illustrating a manufacturing method.

Next, an insulating film formed of a silicon oxide film or the like is formed by a CVD (Chemical Vapor Deposition) method so as to cover the gate electrodes G1a, G1b, and G4. Then, anisotropic etching is performed to form the side wall SW of each of the gate electrodes G1a, G1b, and G4 (FIG. 3B). Next, as shown in FIG. 3C, the PMOS region between the PN boundary 1 and the PN boundary 2 is covered with a mask MSK, and n-type impurities such as P (phosphorus) or As (arsenic) are implanted by ion implantation. As a result, the n-type diffusion regions (ND11, ND12a, ND12b, ND21, ND22a, and ND22b shown in FIG. 1) are formed on the p-type semiconductor. That is, NMOSs are formed. Next, as shown in FIG. 3D, the NMOS region is covered with the mask MSK and p-type impurities such as B (boron) are implanted by ion implantation. As a result, the p-type diffusion regions (PD11, PD12, PD21, and PD22 shown in FIG. 1) are formed on the N-well of the p-type semiconductor. That is, PMOSs are formed.

Figure 3E:
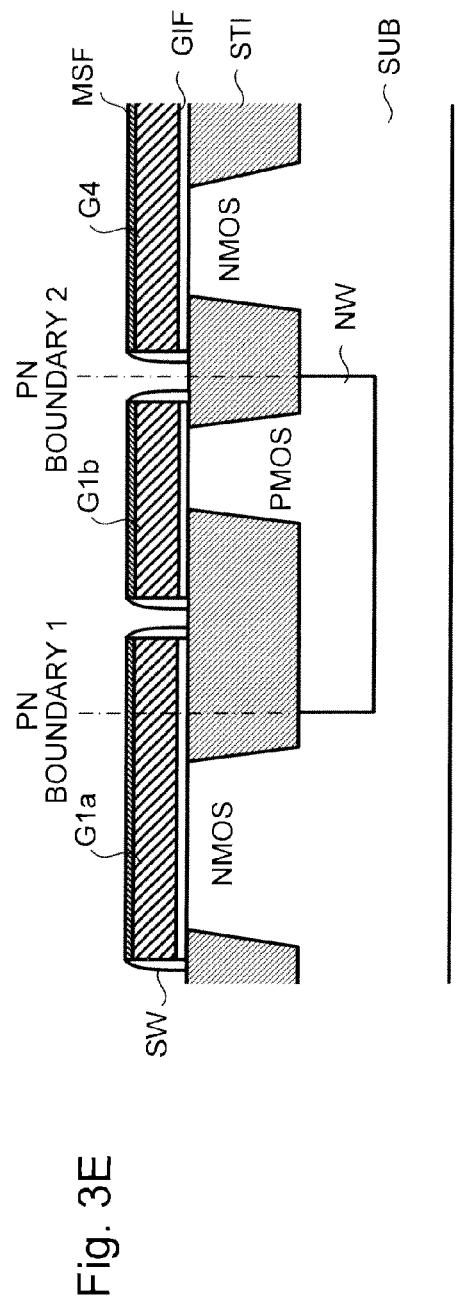
FIG. 3E is a sectional view taken along the line III-III of FIG. 1 for illustrating a manufacturing method.

Next, as shown in FIG. 3E, a metal film formed of Mo (molybdenum), W (tungsten), Co (cobalt), Ti (titanium), Ni (nickel), or the like is formed by sputtering on the entire surface of the substrate. Further, heat treatment is performed to form a metal silicide film MSF on the gate electrodes G1a, G1b, and G4, the p-type diffusion region, and the n-type diffusion region. Note that the unreacted metal film in the region other than the gate electrodes and the diffusion region is removed.

Figure 3F:
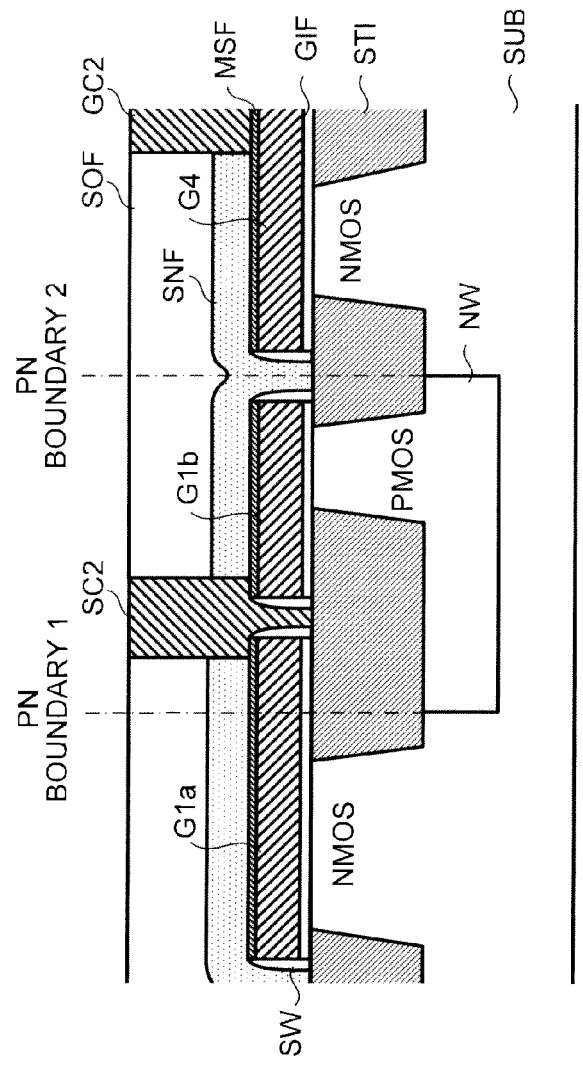
FIG. 3F is a sectional view taken along the line III-III of FIG. 1 for illustrating a manufacturing method.

Lastly, as shown in FIG. 3F, a silicon nitride film (SiN film) SNF and a silicon oxide film ($SiO_2$ film) SOF are formed by a CVD method on the entire surface of the substrate. Further, contact holes are formed in these films, and then W (tungsten) is implanted therein. As a result, the shared contact SC2 and the gate contact GC2 are formed.

Second Embodiment

Figure 4:
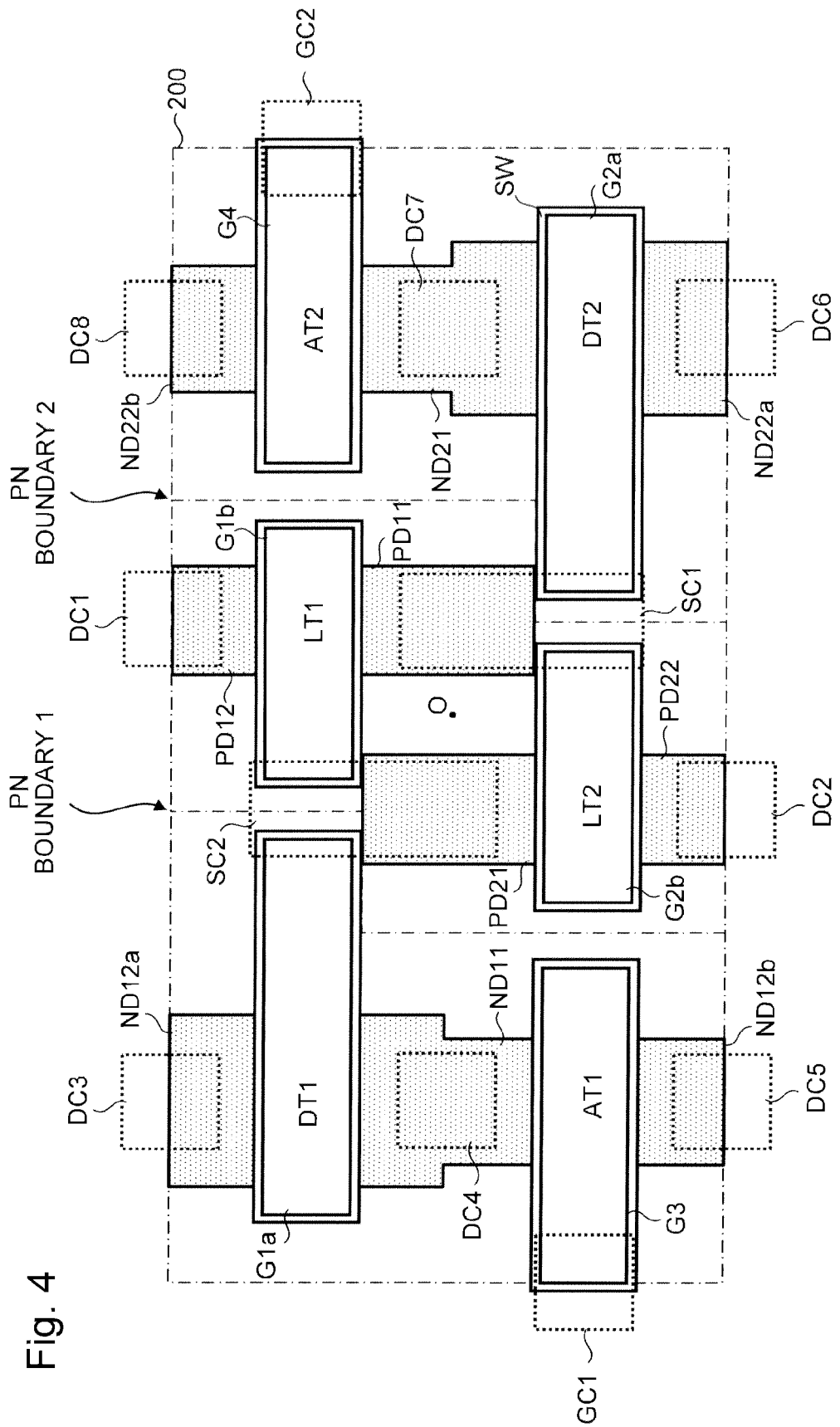
FIG. 4 is a plan view of a unit memory cell of an SRAM according to a second embodiment of the present invention.

Referring now to FIG. 4, an SRAM according to a second embodiment of the present invention will be described. FIG. 4 is a plan view of a unit memory cell 200 of the SRAM according to the second embodiment of the present invention. In the SRAM of the first embodiment shown in FIG. 1 the PN boundary 1 passes through the gate electrode G1a. Accordingly, n-type impurities are implanted on the left side of the gate electrode G1a in FIG. 1, and p-type impurities are implanted on the right side of the gate electrode G1a in FIG. 1. This leads to a possibility that the impurities are mutually diffused in the gate electrode G1a and the operation of the drive transistor DT1 becomes unstable. Meanwhile, in the SRAM of the second embodiment shown in FIG. 4, the PN boundary 1 does not pass through the gate electrode G1a but passes through the gap region between the gate electrodes G1a and G1b. Thus, only the n-type impurities are implanted into the gate electrode G1a, which stabilizes the operation of the drive transistor DT1.

Similarly, in the SRAM of the first embodiment shown in FIG. 1, the PN boundary 2 passes through the gate electrode G2a. Accordingly, n-type impurities are implanted on the right side of the gate electrode G2a shown in FIG. 1, and p-type impurities are implanted on the left side of the gate electrode G2a in FIG. 1. This leads to a possibility that the impurities are mutually diffused in the gate electrode G2a and the operation of the drive transistor DT2 becomes unstable. Meanwhile, in the SRAM of the second embodiment shown in FIG. 4, the PN boundary 2 does not pass through the gate electrode G2a but passes through the gap region between the gate electrodes G2a and G2b. Thus, only the n-type impurities are implanted in the gate electrode G2a, which stabilizes the operation of the drive transistor DT2.

Like in the first embodiment, no diffusion region is formed in the gap region between the gate electrodes G1a and G1b, so that the occurrence of a leak current in the gap region between the gate electrodes which is narrowed due to the miniaturization can be suppressed. Similarly, no diffusion region is formed in the gap region between the gate electrodes G2a and G2b, so that the occurrence of a leak current in the gap region between the gate electrodes which is narrowed due to the miniaturization can be suppressed.

Further, like in the first embodiment, at the tip end of the p-type diffusion region PD11, the gap region between the gate electrodes G2a and G2b is located and the side wall SW is not formed. Accordingly, the p-type diffusion region PD11 and the gate electrodes G2a and G2b can be formed to be in contact with each other. Thus, the contact area between the p-type diffusion region PD11 and the shared contact SC1 increases, resulting in a reduced resistance. At the tip end of the p-type diffusion region PD21, the gap region between the gate electrodes G1a and G1b is located and the side wall SW is not formed. Accordingly, the p-type diffusion region PD21 and the gate electrodes G1a and G1b can be formed to be in contact with each other. Thus, the contact area between the p-type diffusion region PD21 and the shared contact SC2 increases, resulting in a reduced resistance.

Third Embodiment

Figure 5:
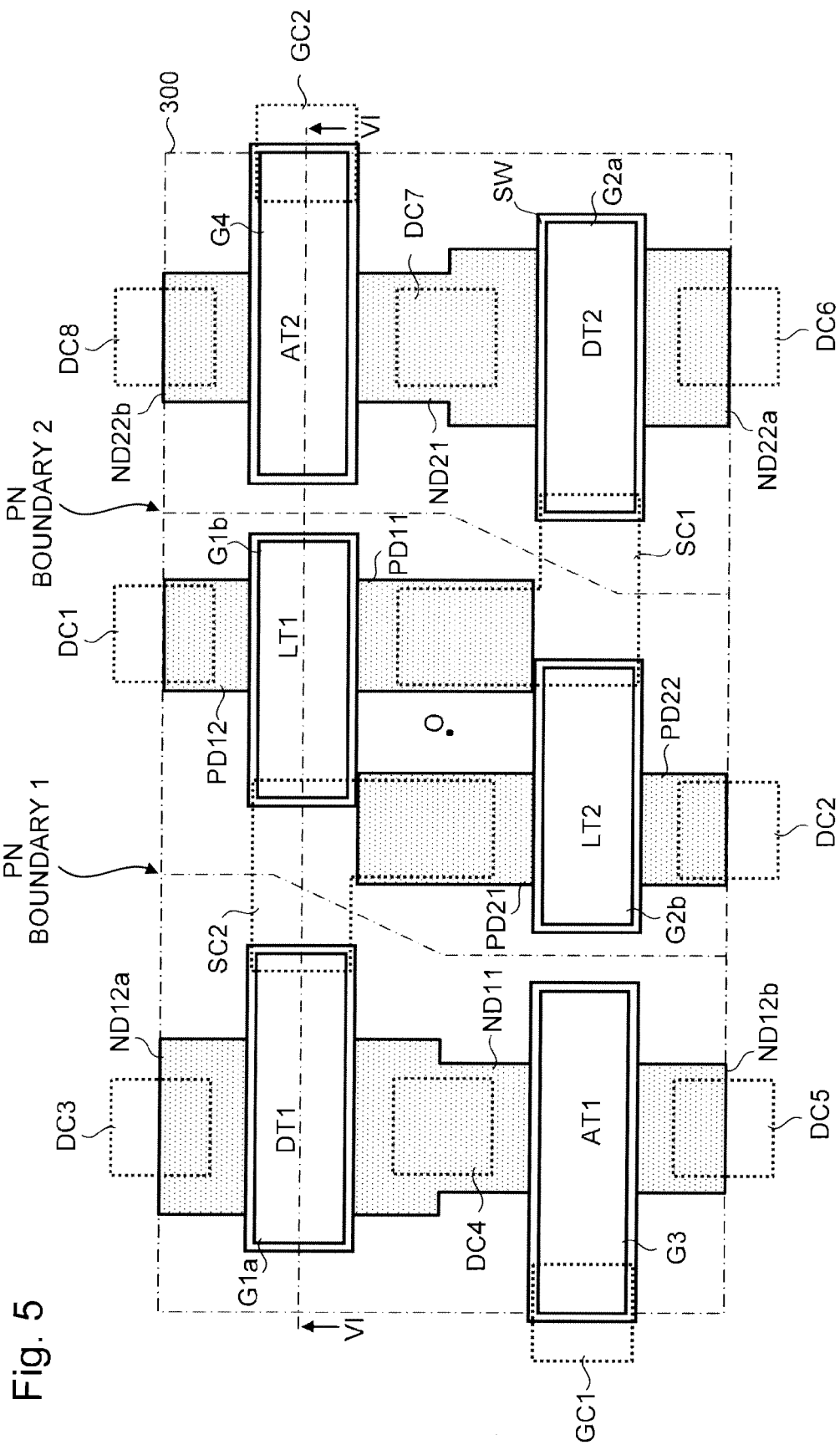
FIG. 5 is a plan view of a unit memory cell of an SRAM according to a third embodiment of the present invention.

Referring now to FIG. 5, an SRAM according to a third embodiment of the present invention will be described. FIG. 5 is a plan view of a unit memory cell 300 of the SRAM according to the third embodiment of the present invention. In the SRAM of FIG. 1 according to the first embodiment, the PN boundary 1 passes through the gate electrode G1a. Accordingly, n-type impurities are implanted on the left side of the gate electrode G1a shown in FIG. 1, and p-type impurities are implanted on the right side of the gate electrode G1a in FIG. 1. This leads to a possibility that the impurities are mutually diffused in the gate electrode G1a and the operation of the drive transistor DT1 becomes unstable. Meanwhile, in the SRAM of the third embodiment shown in FIG. 5, the PN boundary 1 does not pass through the gate electrode G1a but passes through the gap region between the gate electrodes G1a and G1b. Thus, only the n-type impurities are implanted in the gate electrode G1a, which stabilizes the operation of the drive transistor DT1.

Similarly, in the SRAM of the first embodiment shown in FIG. 1, the PN boundary 2 passes through the gate electrode G2a. Accordingly, n-type impurities are implanted on the right side of the gate electrode G2a in FIG. 1, and p-type impurities are implanted on the left side of the gate electrode G2a in FIG. 1. This leads to a possibility that the impurities are mutually diffused in the gate electrode G2a and the operation of the drive transistor DT2 becomes unstable. Meanwhile, in the SRAM of the third embodiment shown in FIG. 5, the PN boundary 2 does not pass through the gate electrode G2a but passes through the gap region between the gate electrodes G2a and G2b. Thus, only the n-type impurities are implanted in the gate electrode G2a, which stabilizes the operation of the drive transistor DT2.

In the SRAM of the second embodiment shown in FIG. 4, the PN boundaries 1 and 2 are bent at a right angle, a misalignment causes characteristic degradation. This makes the actual manufacturing process difficult. Meanwhile, in the SRAM of the third embodiment shown in FIG. 5, the bending degree of the PN boundaries 1 and 2 is smaller than in FIG. 4. This facilitates the actual manufacturing process. In the SRAM shown in FIG. 5, the shared contacts SC1 and SC2 are each formed in an L-shape. As a result, the gap region between the gate electrodes G1a and G1b and the gap region between the gate electrodes G2a and G2b can be widened as compared with those shown in FIG. 4. This makes the bending degree of the PN boundary 1 smaller.

Like in the first embodiment, no diffusion region is formed in the gap region between the gate electrodes G1a and G1b, so that the occurrence of a leak current in the gap region between the gate electrodes which is narrowed due to the miniaturization can be suppressed. Similarly, no diffusion region is formed in the gap region between the gate electrodes G2a and G2b, so that the occurrence of a leak current in the gap region between the gate electrodes which is narrowed due to the miniaturization can be suppressed.

Further, like in the first embodiment, at the tip end of the p-type diffusion region PD11, the gap region between the gate electrodes G2a and G2b is located and the side wall SW is not formed. Accordingly, the p-type diffusion region PD11 and the gate electrodes G2a and G2b can be formed to be in contact with each other. Thus, the contact area between the p-type diffusion region PD11 and the shared contact SC1 increases, resulting in a reduced resistance. Further, at the tip end of the p-type diffusion region PD21, the gap region between the gate electrodes G1a and G1b is located and the side wall SW is not formed. Accordingly, the p-type diffusion region PD21 and the gate electrodes G1a and G1b can be formed to be in contact with each other. Thus, the contact area between the p-type diffusion region PD21 and the shared contact SC2 increases, resulting in a reduced resistance.

Figure 6A:
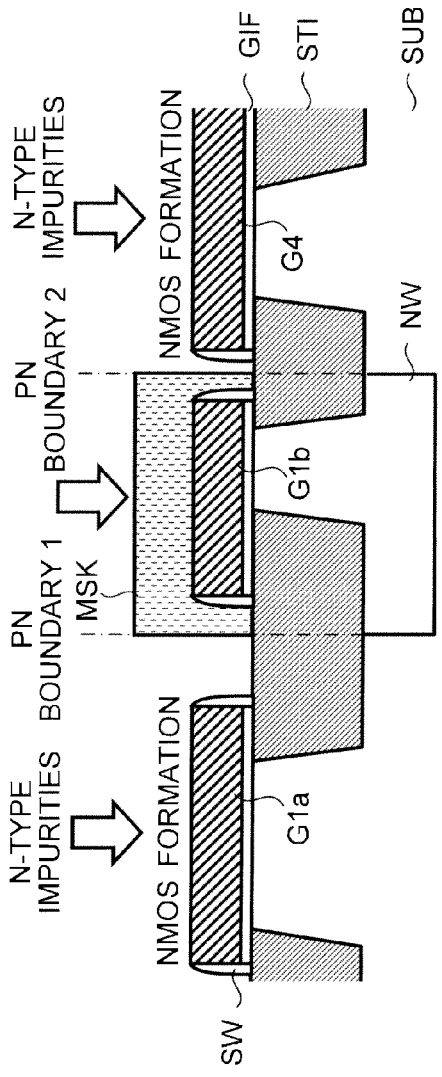
FIG. 6A is a sectional view taken along the line VI-VI of FIG. 5 for illustrating a manufacturing method.
Figure 6B:
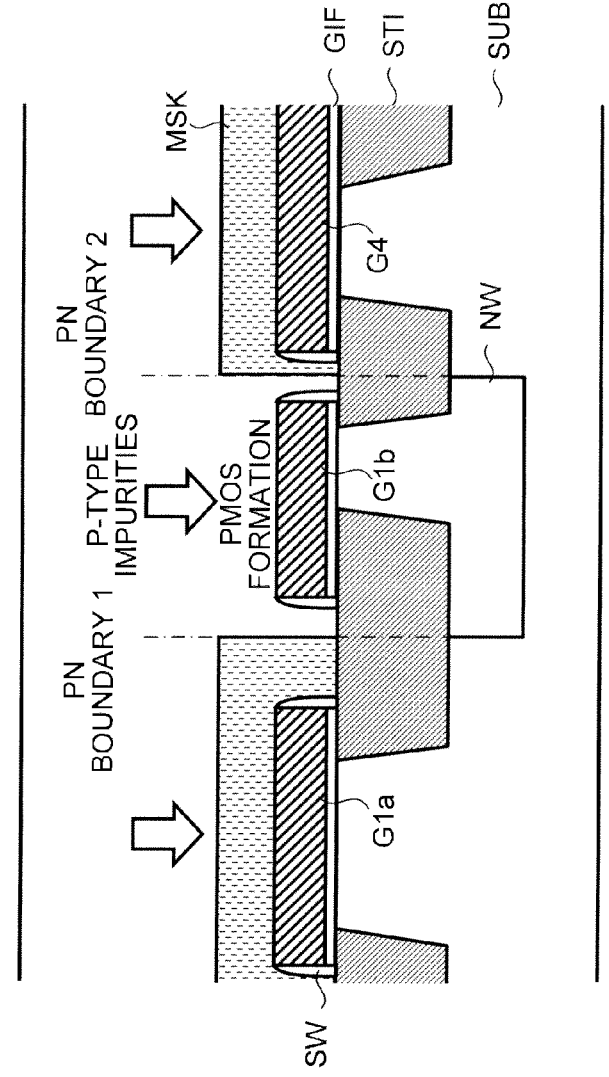
FIG. 6B is a sectional view taken along the line VI-VI of FIG. 5 for illustrating a manufacturing method.

Referring next to FIGS. 6A and 6B, a method for manufacturing the SRAM shown in FIG. 5 will be described. FIGS. 6A and 6B are sectional views taken along the line VI-VI of FIG. 5 for illustrating the manufacturing method. The processes of the first embodiment shown in FIGS. 3A and 3B are similar to those of the third embodiment. In place of the process shown in FIG. 3C of the first embodiment, the PMOS region between the PN boundary 1 and the PN boundary 2 is covered with the mask MSK as shown in FIG. 6A, and n-type impurities such as P (phosphorus) and As (arsenic) are implanted by ion implantation. As a result, the n-type diffusion regions (ND11, ND12a, ND12b, ND21, ND22a, and ND22b shown in FIG. 1) are formed on the p-type semiconductor. That is, the NMOS region is formed. In this case, the entire surface of the gate electrode G1b is covered with the mask MSK. Meanwhile, the entire surfaces of the gate electrodes G1a and G4 are not covered with the mask MSK, and ions are implanted therein.

Next, in place of the process shown in FIG. 3D of the first embodiment, regions other than the PMOS region between the PN boundary 1 and the PN boundary 2 are covered with the mask MSK as shown in FIG. 6B, and p-type impurities such as B (boron) are implanted by ion implantation. As a result, the p-type diffusion regions (PD11, PD12, PD21, and PD22 shown in FIG. 5) are formed on the N-well of the p-type semiconductor. That is, the PMOS region is formed. In this case, the entire surface of the gate electrode G1b is not covered with the mask MSK, and ions are implanted therein. Meanwhile, the entire surfaces of the gate electrodes G1a and G4 are covered with the mask MSK. The manufacturing processes shown in FIGS. 3E and 3F according to the first embodiment are similar to those of the third embodiment. As is seen from FIGS. 6A and 6B, only one of p-type impurities and n-type impurities are implanted in each of the gate electrodes.

Although the present invention has been described with reference to embodiments, the present invention is not limited to the above embodiments. The configuration and details of the present invention can be modified in various manners which can be understood by those skilled in the art within the scope of the present invention.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:

1. An SRAM comprising:
   a first gate electrode that constitutes a first load transistor;
   a second gate electrode that extends in a longitudinal direction of the first gate electrode so as to be spaced apart from the first gate electrode, and constitutes a first drive transistor;
   a third gate electrode that extends in parallel to the first gate electrode, and constitutes a second load transistor;
   a first p-type diffusion region that is formed so as to intersect with the third gate electrode, and constitutes the second load transistor; and
   a first shared contact formed over the first and second gate electrodes and the first p-type diffusion region,
   wherein the first p-type diffusion region extends to the vicinity of a first gap region between the first and second gate electrodes, and is not formed in the first gap region.

2. The SRAM according to claim 1, further comprising:
   a fourth gate electrode that extends in a longitudinal direction of the third gate electrode so as to be spaced part from the third gate electrode, and constitutes a second drive transistor;
   a second p-type diffusion region that is formed so as to intersect with the first gate electrode, and constitutes the first load transistor; and
   a second shared contact formed over the third and fourth gate electrodes and the second p-type diffusion region,
   wherein the second p-type diffusion region extends to the vicinity of a second gap region between the third and fourth gate electrodes, and is not formed in the second gap region.

3. The SRAM according to claim 2, wherein an isolation layer is formed in each of the first and second gap regions.

4. The SRAM according to claim 2, wherein the first and second shared contacts each have an L-shape.

5. The SRAM according to claim 2, wherein the first and second p-type diffusion regions have the same dimensions and are formed to he symmetrical about a point.

6. The SRAM according to claim 2, further comprising:
   a first n-type diffusion region that intersects with the second gate electrode and constitutes the first drive transistor; and
   a second n-type diffusion region that intersects with the fourth gate electrode and constitutes the second drive transistor.

7. The SRAM according to claim 6, further comprising:
   a fifth gate electrode that is formed as an extension of one end of the third gate electrode, intersects with the first n-type diffusion region, and constitutes a first access transistor; and
   a sixth gate electrode that is formed as an extension of one end of the first gate electrode, intersects with the second n-type diffusion region, and constitutes a second access transistor.

* * * * *